(12) United States Patent
Oga et al.

(10) Patent No.: US 7,385,856 B2
(45) Date of Patent: Jun. 10, 2008

(54) NON-VOLATILE MEMORY DEVICE AND INSPECTION METHOD FOR NON-VOLATILE MEMORY DEVICE

(75) Inventors: Hirofumi Oga, Kanagawa (JP); Masahiko Kashimura, Kanagawa (JP); Masakazu Amanai, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 33 days.

(21) Appl. No.: 11/087,589

(22) Filed: Mar. 24, 2005

(65) Prior Publication Data

US 2005/0213418 A1 Sep. 29, 2005

(30) Foreign Application Priority Data

Mar. 25, 2004 (JP) ............................. 2004-089503

(51) Int. Cl.
*G11C 16/04* (2006.01)
(52) U.S. Cl. ..................... 365/185.26; 365/185.28; 365/189.04
(58) Field of Classification Search ................ 365/226, 365/185.02, 185.28, 185.26, 189.04
See application file for complete search history.

(56) References Cited

U.S. PATENT DOCUMENTS

| | | | | |
|---|---|---|---|---|
| 5,754,482 A | * | 5/1998 | Su et al. ................. | 365/189.07 |
| 5,761,125 A | * | 6/1998 | Himeno .................. | 365/185.24 |
| 5,852,578 A | * | 12/1998 | Hoang .................... | 365/185.28 |
| 5,912,842 A | * | 6/1999 | Chang et al. ........... | 365/185.11 |
| 5,986,940 A | * | 11/1999 | Atsumi et al. ........... | 365/185.3 |
| 6,097,638 A | * | 8/2000 | Himeno et al. ......... | 365/185.25 |
| 6,441,428 B1 | * | 8/2002 | Ghodsi ................... | 365/185.27 |
| 2004/0196695 A1 | * | 10/2004 | Tanaka et al. ......... | 365/185.01 |

FOREIGN PATENT DOCUMENTS

| | | |
|---|---|---|
| JP | 3198998 B2 | 8/2001 |
| JP | 2004-14052 A | 1/2004 |

* cited by examiner

*Primary Examiner*—Thong Q. Le
(74) *Attorney, Agent, or Firm*—Sughrue Mion, PLLC

(57) ABSTRACT

A non-volatile memory device comprises a plurality of bit lines extending in a first direction, a plurality of word lines extending in a second direction substantially perpendicular to the first direction, a plurality of memory cells provided respectively so as to correspond to the positions of the intersections between the plurality of bit lines and the plurality of word lines, a plurality of source lines corresponding to a plurality of memory cells which are connected to a same bit line, a current source capable of supplying the constant current to a selected memory cell and the corresponding bit line and a voltage control circuit which keeps a voltage of a selected bit line equal to or higher than a predetermined voltage.

21 Claims, 4 Drawing Sheets

NON-VOLATILE MEMORY DEVICE AND INSPECTION METHOD FOR NON-VOLATILE MEMORY DEVICE

BACKGROUND OF THE INVENTION

1. Field of the Invention

The present invention relates to a non-volatile memory device and an inspection method for a non-volatile memory device.

2. Description of the Related Art

Flash memories and EEPROMs, (hereafter, simply called "memory cells") are known as non-volatile memory devices. Data stored in the non-volatile memory is not deleted even if the power supply is turned off, provided that it is not erased or overwritten.

Data is written by means of channel hot electrons. Channel hot electrons are generated when a predetermined constant current flows between the source and drain of memory cell. FIG. 1 is a circuit diagram partly showing the structure of a conventional non-volatile memory device. This non-volatile memory device comprises a current supply circuit 106, a current supply circuit 107 (including a switch 124), a plurality of memory cells 1151, 1152 (although only two are illustrated in the drawing), a plurality of bit lines 117 (although only one is illustrated in the drawing), a plurality of word lines 1181, 1182 (although only two are illustrated in the drawing), and a plurality of source lines 119 (although only one is illustrated in the drawing). A memory cell array 112 is described as an example. In the memory cell array 112, memory cells 1151 and 1152 shares the source line 119.

The bit lines 117 extend in the Y direction (first direction) The word lines 1181, 1182 extend in the X direction (second direction) which is substantially perpendicular to the Y direction (first direction).

Memory cells 1151 and 1152 are disposed respectively at the positions where the plurality of bit lines 117 and the plurality of word lines 118 intersect with each other. In the memory cells 115, data is written by means of channel hot electrons. Channel hot electrons are generated when a predetermined constant current flows between the source and drain of memory cell 1151 and 1152. The non-volatile memory device illustrated in FIG. 1 is a split gate type non-volatile memory device. The control gate of this memory is connected to the word line 118, the source, to the source line 119, and the drain, to the bit line 117.

The current supply circuit 106 is able to supply a constant current, which is substantially uniform, to the memory cells 1151 and 1152 and its corresponding bit line 117. The current supply circuit 107 supplies a current to the bit line 117, via the switch 124.

The operation of writing data to this memory cell 1151 is described below.

Firstly, a selected bit line 117s, a selected word line 1181s and a selected source line 119s are selected respectively among the plurality of bit lines 117, the plurality of word lines 118 and the plurality of source lines. A selected cell 1151s is selected among the plurality of memory cells, by means of the selected bit line 117s and the selected word line 1181s. Next, a voltage VSW (source voltage) is applied to the selected source line 119s, a voltage VWW (gate voltage) is applied to the selected word line 1181s. The current supply circuit 106 supplies a predetermined constant current from the selected source line 119s to the selected bit line 117s via the source of the selected cell 1151s and the drain of the selected cell. In this case, the voltage VBW of the selected bit line (namely, the drain voltage), is VWW–Vth, where Vth is the threshold voltage of the selected memory cell 1151s. When the constant current flows in the selected memory cell 1151s, channel hot electrons are generated. Data is written to the memory cell 115s by injecting these channel hot electrons to the floating gate of the cell 1151s.

The data is read out from the memory cell 115 as described below.

Firstly, a selected bit line 117s and a selected word line 1181s are selected respectively among the plurality of bit lines 117 and the plurality of word lines 118. The plurality of source lines 119 are fixed to 0V and are not selected. A selected cell 1151s is selected among the plurality of memory cells on the basis of the selected bit line 117s and the selected word line 1181s. Next, a voltage VWR (gate voltage) is applied to the selected word line 1181, and a voltage VBR (drain voltage) is applied to the selected bit line 117s. A sense amplifier (not illustrated) senses the current that flows in the path from the selected bit line 117s, to the drain of the selected cell 1151s, the source of the selected cell 1151s, and the corresponding source line 119s (0V). Since the current varies depending on the electric charge (stored data) accumulated in the floating gate, then it is therefore possible to read out the data.

When a write operation is performed in the memory cell 1151s described above, if the threshold voltage Vth is high, then the drain voltage of the memory cell 1151s (=voltage of bit line 117, VBW=VWW–Vth) becomes low. In this case, the difference between the source voltage of the memory cell 1152 (=voltage of source line 119, VSR=fixed value) and the drain voltage becomes high, and it becomes easier for channel hot electrons to be generated in the memory cell 1152. Thereby, non intentional writing (writing disturb) may be caused.

Therefore, it is desirable to screen a memory cell which has high threshold voltage Vth such as 1151s. It is required that the reliability of the memory cell is improved.

Related technology for a non-volatile memory device is disclosed in Japanese Patent No. 3198998.

This non-volatile memory device comprises a first and second voltage supply circuits. The first voltage supply circuits apply a first voltage to the non-selected memory cells. The second voltage supply circuits apply a second voltage to the selected memory cells. The timing of applying first voltage and second voltage is controlled.

Related technology for a non-volatile memory device is also disclosed in Japanese Unexamined Patent Application Publication No. 2004-14052.

This memory device is provided with a memory cell array in which memory cell units are arranged. In this memory device, a ground potential is given to a word line being adjacent to the word line to be written after a potential being larger than 0V is given, and a writing potential is given to the word line to be written.

SUMMARY OF THE INVENTION

A non-volatile memory device comprises a plurality of bit lines extending in a first direction, a plurality of word lines extending in a second direction substantially perpendicular to the first direction, a plurality of memory cells provided respectively so as to correspond to the positions of the intersections between the plurality of bit lines and the plurality of word lines, a plurality of source lines corresponding to a plurality of memory cells which are connected to a same bit line, a current source capable of supplying the constant current to a selected memory cell and the corresponding bit line and a voltage control circuit which keeps a voltage of a selected bit line equal to or higher than a predetermined voltage.

An inspection method for a non-volatile memory device comprises selecting a selected word line from a plurality of word lines, selecting a selected bit line from a plurality of bit lines, writing data to a selected cell by causing a constant current on the selected cell and the selected bit line in keeping a voltage of the selected bit line equal to or higher than a predetermined voltage and determining whether data is written to the selected cell or not.

According to the present invention, the memory cell which disturbs other memory cells can be detected and screened. The reliability of the memory cell is improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
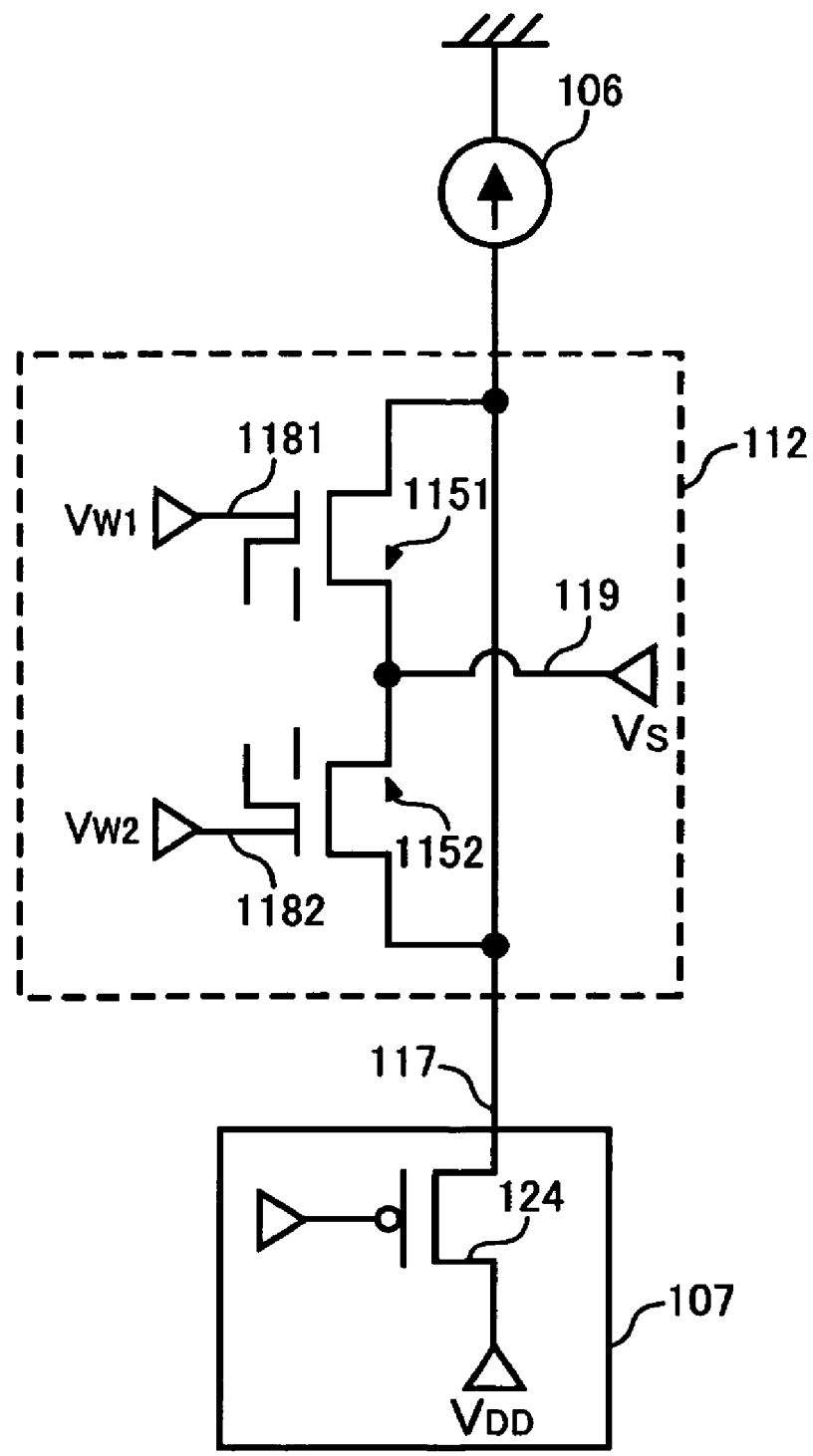
FIG. 1 partly shows a composition of a conventional non-volatile memory device.
Figure 2:
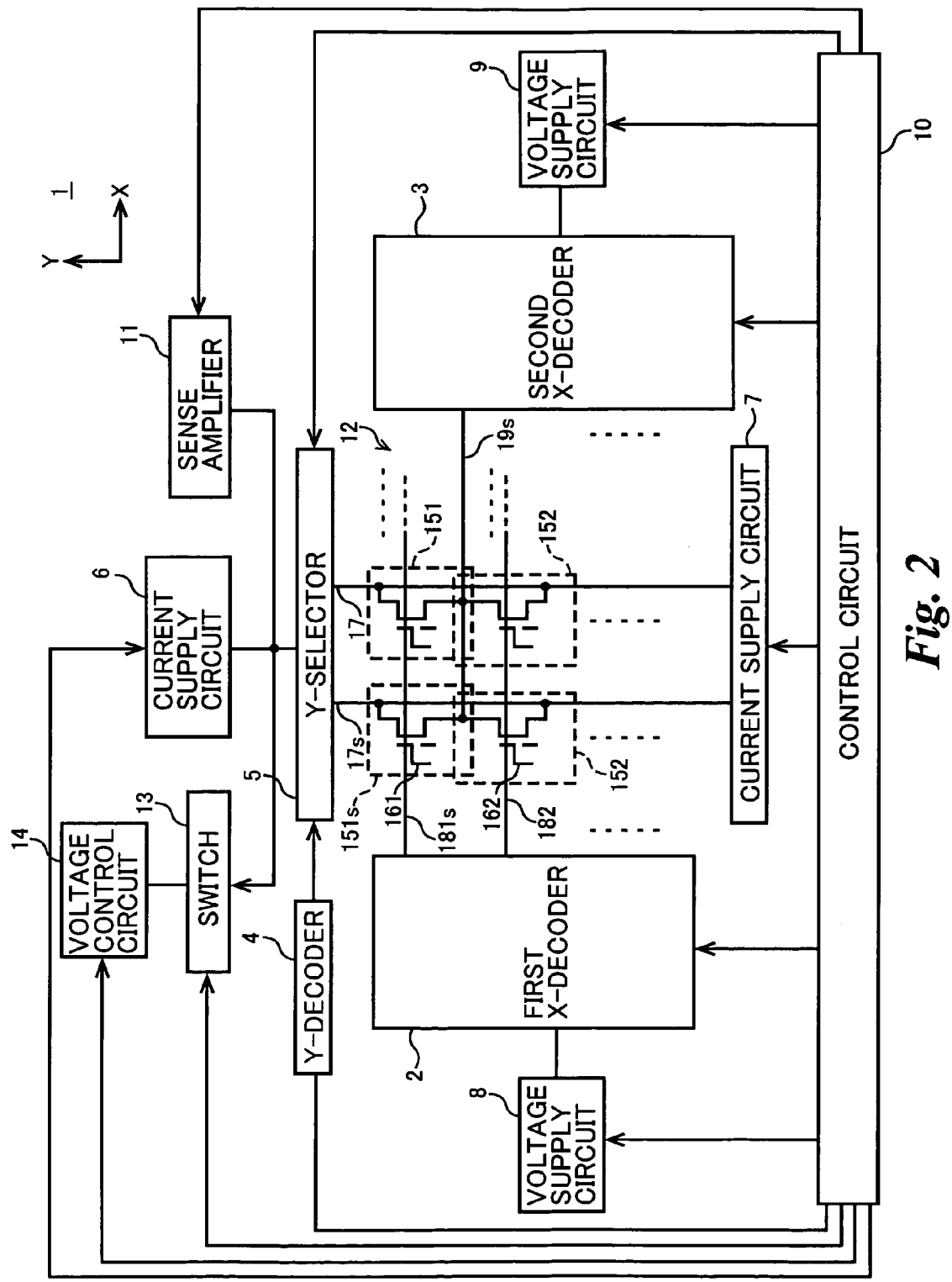
FIG. 2 is a circuit block diagram showing the composition of an embodiment of the non-volatile memory device according to the present invention.

An embodiment of a non-volatile memory device and an inspection method for a non-volatile memory device according to the present invention is described with reference to the drawings. FIG. 2 is a circuit block diagram showing the structure of a first embodiment of a non-volatile memory device according to the present invention. The non-volatile memory device 1 a first X decoder 2, a second X decoder 3, a Y decoder 4, a Y selector 5, a switch 13, a voltage control circuit 14, a plurality of bit lines 17 (in the diagram, only two are depicted), a plurality of word lines 18 (in the diagram, a couple of word lines 181 and 182 is depicted), a plurality of source lines 19 (in the diagram, only one is depicted), a plurality of memory cells 15 (in the diagram, only four 151 and 152 are depicted), a current supply circuit 6, a current supply circuit 7, a voltage supply circuit 8, a voltage supply circuit 9, a control circuit 10, a sense amplifier 11. The memory array 12 comprises a plurality of memory cells 15.

The bit lines 17 extend in the Y (first) direction. One end of each bit line is connected to the Y selector 5, and the other end thereof is connected respectively to the current supply circuit 7. The word lines 18 extend in the X direction (second direction), which is substantially perpendicular to the Y direction (first direction). Here, "substantially" means within a certain range of error (the same applies below). One terminal of each word line is connected to the first X decoder 2. The source lines 19 extend in the X direction. One end of each source line is connected to the second X decoder 3. The source lines 19 are formed between the memory cells 151 and 152. The memory cells 151 and 152 share the source line, and are connected to the same bit line 17. The source line 19 can be shared by more than two memory cells on the same bit line.

Memory cells 15 are provided respectively at the positions of the intersections between the plurality of bit lines 17 and the plurality of word lines 18. These memory cells are non-volatile semiconductor memory cells. Data is written to the memory cells by a predetermined constant current flowing between the drain and the source. When the predetermined constant current flows, the channel hot electrons are generated and injected to a floating gate. A split gate type non-volatile memory is depicted as one example of a non-volatile semiconductor memory cell. In each cell, the control gate is connected to a word line 18, the source is connected to a source line 19 and the drain is connected to a bit line 17.

The control gate, source and drain of the memory cell 151 are connected respectively to the word line 181, the source line 19 and the bit line 17. The control gate, source and drain of the memory cell 152 are connected respectively to the word line 182, the source line 19 and the bit line 17.

The first X decoder 2 selects (activates) one word line 18 (181 or 182) to be a selected word line 18 (181 or 182) s, among the plurality of word lines 18 (181 and 182), based on a control signal from the control circuit 10. The second X decoder 3 selects (activates) one source line 19 to be a selected source line 19s, among the plurality of source lines 19, based on a control signal from the control circuit 10. Alternatively, it selects all of the plurality of source lines 19. The Y decoder 4 decodes the address signal included in the control signal received from the control circuit 10, and outputs this address signal to the Y selector 5. The Y selector 5 selects (activates) one bit line 17 to be a selected bit line 17s, among the plurality of bit lines 17, based on the control signal from the control circuit 10 and the address signal from the Y decoder 4. Alternatively, it selects all of the plurality of bit lines 17.

Based on the selected bit line 17s and the selected word line 18s, (and the selected source line 19s), one memory cell 15 (151 or 152) is selected as a selected cell 15 (151 or 152) s among the plurality of memory cells 15 (151 and 152). If all of the plurality of bit lines 17 are selected, then the memory cells 15 (151 or 152) on the selected word line 18s are selected as the selected cells 15 (151 or 152) s.

The current supply circuit 6 is able to supply a constant current which is substantially uniform, via the Y selector 5, to a path from the bit line 17, to the memory cell 15, to the source line 19, on the basis of the control signal from the control circuit 10. The current supply circuit 7 is able to supply a constant current to the bit line 17 on the basis of the control signal from the control circuit 10.

The voltage control circuit 14 is able to keep a voltage of bit line 17 equal to or more than a predetermined voltage. The voltage control circuit 14 supplies a voltage via the switch 13, and operates based on the control signal from the control circuit 10.

Figure 3:
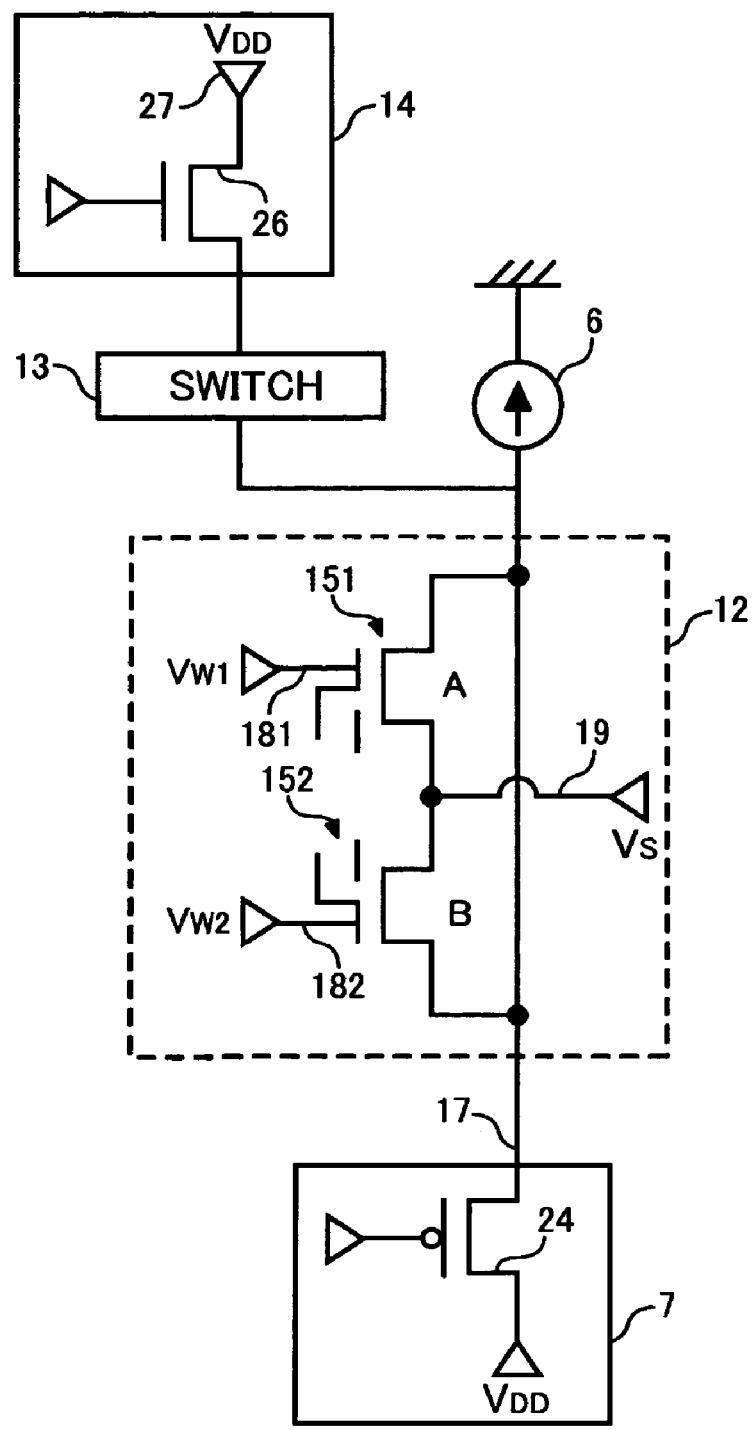
FIG. 3 partly shows a composition of the non-volatile memory device according to the embodiment of the present invention.

FIG. 3 is a circuit diagram partly showing the structure of a non-volatile memory device of the embodiment. The same reference numerals are applied to the same structure as shown in FIG. 2. The voltage control circuit is connected to the bit line 17, and connected in parallel to the current supply circuit 6. The voltage control circuit 14 is a clamp circuit which has an N-channel transistor 26 and a power supply 27.

The voltage control circuit 14 clamps a voltage of bit line 17 when an external voltage Vdp is applied to the gate of the transistor 26. The clamped voltage is Vdp−Vtn, where the Vtn is a threshold voltage of the transistor 26. Thereby, the voltage of the bit line 17 can be controlled by controlling the external voltage Vdp. The voltage Vdp−Vtn of the selected bit line 17s is controlled to keep a predetermined voltage or higher. The predetermined voltage is a voltage that an unintended writing does not occur to the unselected memory cell (in this case, memory cell 152), which shares the source line 19 with selected memory cell 151s.

The voltage supply circuit 8 is able to apply a predetermined voltage respectively to the word line 18 (181 and 182), via the first X decoder 2 on the basis of the control signal from the control circuit 10. The voltage supply circuit 9 is able to apply a predetermined voltage respectively to the source line 19, via the second X decoder 3 on the basis of the control signal from the control circuit 10.

During a read out operation, the sense amplifier 11 reads out the data stored in the selected cell 15s based on the current flowing in the selected cell 15s.

The control circuit 10 controls the operations of the first X decoder 2, the second X decoder 3, the Y decoder 4, the Y selector 5, the switch 13, the current supply circuit 6, the current supply circuit 7, the voltage supply circuit 8, the voltage supply circuit 9 and the sense amplifier 11. For example, a CPU can be used as a control circuit 10. Under the control of the control circuit 10, a write operation, read-out operation, erase operation and screening test are carried out. For example, the control circuit 10 controls these operations based on a prescribed program. The program may be stored in a storage device, such as a ROM (not illustrated).

A write operation and read-out operation performed in the non-volatile memory device 1 will be described. The operations of the memory cell 151 are described below as an example. Referring to FIG. 2, a data write operation to a memory cell 15 (151 and 152) is carried out as described below.

Firstly, a selected word line 181s is selected from the plurality of word lines 18 by the first X decoder 2. A selected source line 19s is selected among the plurality of source lines by the second X decoder 3. A selected bit line 17s is selected among the plurality of bit lines 17 by the Y selector 5. A selected cell 151s is selected among the plurality of memory cells 151, 152 in accordance with the selected bit line 17s and the selected word line 181s.

Next, the voltage supply circuit 9 applies a voltage VSW (source voltage, e.g. 7.5V) to the selected source line 19s. The voltage supply circuit 8 applies a voltage VWW (gate voltage, e.g. 1.5V) to the selected word line 181s.

A predetermined constant current flows from the selected source line 19s to the selected bit line 17s via the source and the drain of the selected cell 151s by the current supply circuit 6.

In this case, the voltage VBW (drain voltage) of the selected bit line is VWW−Vth. Vth is the threshold voltage of the selected cell 15s. In this case, data is written to the selected cell 151s by injecting channel hot electrons into the floating gate. The channel hot electrons are generated by the constant current flowing in the selected cell 151s.

In the case of the example voltages given above, the unselected source lines 19 is a floating state, the unselected word lines 18 are set to 0V, and the unselected bit lines 17 are set to 3.2V.

A data read-out operation from a memory cell 15 (151 and 152) is now described with reference to FIG. 2.

Firstly, a selected word line 181s is selected from the plurality of word lines 18 by the first X decoder 2. A selected bit line 17s is selected from the plurality of bit lines 17 by the Y selector 5. No source line is selected, and all of the plurality source lines are set to 0V. A selected cell 151s is selected from the plurality of memory cells, in accordance with the selected bit line 17s and the selected word line 181s.

Next, the voltage supply circuit 8 applies a voltage VWR (gate voltage, e.g. 2.5V) to the selected word line 18s. The selected bit line 17s is set to a voltage VBR (drain voltage, e.g. 0.5V). The sense amplifier 11 senses the current flowing from the selected bit line 17s to selected source line 19s, via the drain and the source of the selected cell 151s. In this case, since the amount of the current varies depending on the electric charge (stored data) that has been accumulated in the floating gate of the cell, then the stored data can be read out.

In the case of the example voltages given above, the unselected word lines 18 and bit lines 17 are set respectively to 0V.

An operation of erasing data in the memory cell 15 is described with reference to FIG. 2.

Firstly, a selected word line 181s is selected from the plurality of word lines 18 by the first X decoder 2. The plurality of source lines 19 and the plurality of bit lines 17 are all set to 0V and are not selected. All of the memory cells 15 on the selected word line 18s are selected as selected cells 15s.

Thereupon, the voltage supply circuit 8 applies a voltage VWR (gate voltage, e.g. 12V) to the selected word line 181s. Consequently, the electrons are extracted from the floating gate, by a Fowler-Nordheim (FN) tunneling effect, and hence the data can be erased.

Figure 4:
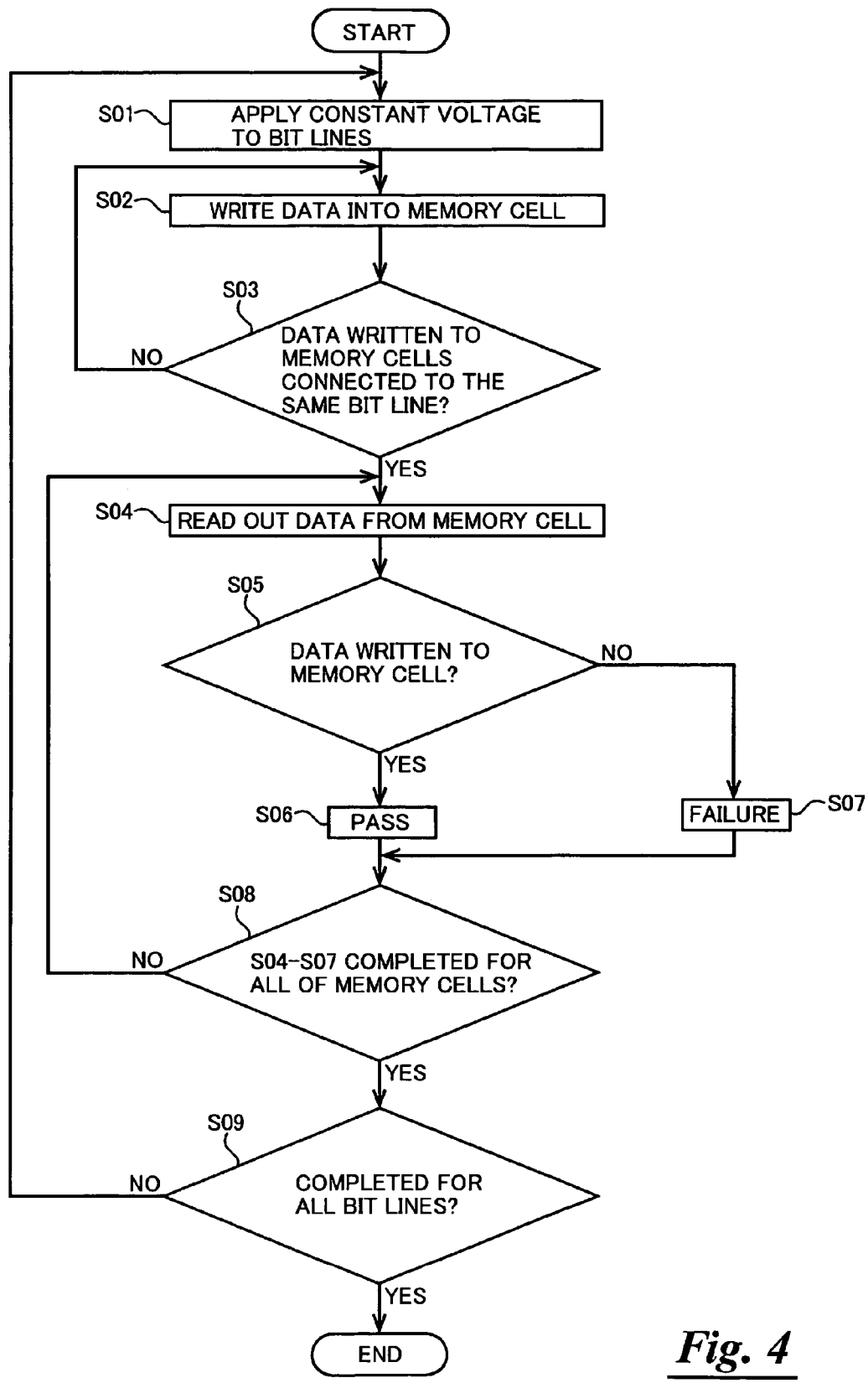
FIG. 4 is a flow chart showing an embodiment of an inspection method for a non-volatile memory device according to the present invention.

Next, an inspection method is described with reference to the drawings. FIG. 4 is a flow chart showing the embodiment of the inspection method for a non-volatile memory device according to the present invention.

(1) Step S01
A selected bit line 17s is selected from the plurality of bit lines 17 by the Y selector 5. The voltage control circuit 14 is electrically connected to the selected bit line 17s via the switch 13. A predetermined voltage Vdp is applied to the transistor 26 of the voltage control circuit 14.

(2) Step S02
A selected word line 181s is selected from the plurality of word lines 18 by the first X decoder 2. A selected source line 19s is selected from the plurality of source lines by the second X decoder 3. The selected bit line 17s is already selected in Step S01. A selected cell 151s is selected from the plurality of memory cells, in accordance with the selected bit line 17s and the selected word line 181s.

The voltage supply circuit 9 applies a voltage VSW (source voltage, e.g. 7.5V) to the selected source line 19s. The voltage supply circuit 8 applies a voltage VWW (gate voltage, e.g. 1.5V) to the selected word line 181s. The current supply circuit 6 causes a predetermined constant current to flow from the selected source line 19s to the selected bit line 17s, via the source and the drain of the selected cell 151s. In this case, the voltage VBW (drain voltage) of the selected bit line 17s is VWW−Vth. Vth is the threshold voltage of the selected cell 151s.

In case that the voltage VBW of the selected bit line 17s is lower than Vdp−Vtn (for example, 0.4V), the transistor 26 of the voltage control circuit 14 becomes on-state. The voltage of the selected bit line 17s is clamped at Vdp−Vtn. The constant current flows from the power supply VDD 27 to the current supply circuit 6 via the transistor 26, and the constant current does not flow into the selected cell 151s.

That is, data is not written to the selected cell 151s. The voltage VBW of the selected bit line 17s is lower than Vdp−Vtn. That means, VBW=VWW−Vth<Vdp−Vtn, and VWW−(Vdp−Vtn)<Vth (for example, 1.5−0.4=1.1<Vth). This expression means the threshold voltage of the selected cell 151s is higher than the intended threshold voltage. In case that the voltage VBW of the selected bit line 17s is higher than Vdp−Vtn, the transistor 26 of the voltage control circuit 14 becomes off-state. The selected bit line 17s is not influenced by the voltage control circuit 14. The constant current flows into the selected cell 151s, and the data is written to the selected cell 151s.

As described above, according to the voltage control circuit 14, data is not written to the selected cell 151s in case that the actual threshold voltage Vth of the selected cell 151s is higher than the intended threshold voltage.

(3) Step S03

The control circuit 10 determines whether or not data has been written to other memory cells 15 located on the same selected bit line 17s as the selected cell 151s. If data is not written to the other cells (Step S03: No), then the procedure returns to step S01 and data writing is continued for the remaining memory cells 15.

(4) Step S04

A selected word line 181s is selected from the plurality of word lines 18 by the first X decoder 2. No source line 19 is selected, and the ground voltage (0V) is applied to all the source lines 19. The selected bit line 17s is already selected in Step S01. A selected cell 151s is selected from the plurality of memory cells, in accordance with the selected bit line 17s and the selected word line 181s. The read out operation as described above is performed to the selected cell 151s.

(5) Step S05

The control circuit 10 determines whether or not data has been written to the selected cell 151s, on the basis of the read out data. That is, the control circuit 10 judges whether or not data has been written to the selected cell 151s in the writing operation of Step S02.

(6) Step S06

If data has been written to the selected cell 15s (Step S04: Yes), then that selected cell 151s is taken to have passed the screening test, and the control circuit 10 outputs a signal indicating a pass.

(7) Step S07

If no data has been written to the selected cell 15s, (Step S04: No), then that selected cell 151s is taken not to have passed the disturb test, and the control circuit 10 outputs a signal indicating a failure.

(8) Step S08

The control circuit 10 determines whether or not the inspection in steps S04-S07 has been completed for all of the memory cells 15 on the selected bit line 17s selected at step S01. If it has not been completed (Step S08: No), then the procedure returns to step S04 and inspection is continued for the remaining memory cells 15.

(9) Step S09

The control circuit 10 determines whether or not the inspection in steps S01-S08 has been completed for all of the bit lines 17 relating to the memory cell array 12 under inspection. If inspection has been completed (Step S09: No), then the procedure returns to step S01 and inspection is continued for the memory cells 15 on the remaining bit lines 17.

The inspection method is carried out by means of the steps S01-S09 described above.

If the threshold voltage of the selected cell 151s is high, the difference between drain voltage and source voltage of the non-selected cell, which shares the source line with the selected cell, is increased. The unintended writing may occur to the non-selected cell 15. In this case, data is properly written to the selected cell 15 which has higher threshold voltage. Therefore, It is difficult to detect the memory cell 15 which has higher threshold voltage in a screening test which test a writing error. According to the inspection method for non-volatile memory device of the present invention, if the threshold voltage of the selected cell 151s is high, the writing operation is not performed properly. Therefore, the memory cell which has higher threshold voltage can be detected in the screening test.

According to the present invention, the memory cell which disturbs other memory cells, which share the source line with this memory cell, can be detected, and be screened. The reliability of the memory cell is improved.

It is apparent that the present invention is not limited to the above embodiment and it may be modified and changed without departing from the scope and spirit of the invention.

What is claimed is:

1. A non-volatile memory device comprising: a plurality of bit lines extending in a first direction; a plurality of word lines extending in a second direction substantially perpendicular to the first direction; a plurality of memory cells provided respectively so as to correspond to the positions of the intersections between the plurality of bit lines and the plurality of word lines; a plurality of source lines corresponding to a plurality of memory cells which are connected to a same bit line; a current source capable of supplying the constant current to a selected memory cell and the corresponding bit line; and a voltage control circuit which keeps a voltage of a selected bit line equal to or higher than a predetermined voltage.

2. The non-volatile memory device according to claim 1, wherein the voltage control circuit keeps the voltage of the selected bit line equal to or higher than a predetermined voltage when a writing operation to a selected cell is performed.

3. The non-volatile memory device according to claim 1, wherein the predetermined voltage prevents a non-selected cell from an unintended writing when the voltage of the selected bit line is equal to or higher than the predetermined voltage.

4. The non-volatile memory device according to claim 1, wherein the voltage control circuit keeps the voltage of the selected bit line equal to or higher than a predetermined voltage when the writing operation in the writing test of the memory cell.

5. The non-volatile memory device according to claim 1, wherein the voltage control circuit includes a clamp circuit.

6. The non-volatile memory device according to claim 2, wherein the non-volatile memory device determines the selected memory cell as a failure when the write operation is not performed successfully.

7. The non-volatile memory device according to claim 1, wherein the voltage control circuit includes a transistor, and the voltage of the selected bit line is clamped at $V_{dp}-V_{tn}$ if the voltage of the selected bit line is lower than $V_{dp}-V_{tn}$, wherein $V_{dp}$ is an external voltage applied to a gate of the transistor and $V_{tn}$ is a threshold voltage of the transistor; and the predetermined voltage is given by $VWW-V_{th}$, wherein VWW is a gate voltage applied to a selected word line corresponding to the selected memory cell, and $V_{th}$ is a threshold voltage of the selected memory cell.

8. The non-volatile memory device according to claim 1, wherein the voltage control circuit keeps the voltage of the selected bit line equal to or higher than a predetermined voltage during a writing operation in a writing test of the memory cell.

9. An inspection method for a non-volatile memory device comprising: selecting a selected word line among a plurality of word lines; selecting a selected bit line among a plurality of bit lines; writing data to a selected cell by causing a constant current on the selected cell and the selected bit line while keeping a voltage of the selected bit line equal to or higher than a predetermined voltage; and determining whether data is written to the selected cell or not.

10. The inspection method for a non-volatile memory device according to claim 9, wherein the non-volatile memory comprises a plurality of source lines corresponding to a plurality of memory cells which are connected to a same bit line.

11. The inspection method for a non-volatile memory device according to claim 9, wherein the predetermined voltage prevents a non-selected cell from an unintended writing when the voltage of the selected bit line is equal to or higher than the predetermined voltage.

12. The inspection method for a non-volatile memory device according to claim 10, wherein the predetermined voltage prevents a non-selected cell from an unintended writing when the voltage of the selected bit line is equal to or higher than the predetermined voltage.

13. The inspection method for a non-volatile memory device according to claim 9, further comprising: determining the selected cell as failure when the data is not written to the selected cell.

14. The inspection method for a non-volatile memory device according to claim 9, wherein the non-volatile memory comprises a voltage control circuit which keeps the voltage of the selected bit line equal to or higher than the predetermined voltage.

15. The inspection method for a non-volatile memory device according to claim 10, wherein the non-volatile memory comprises a voltage control circuit which keeps the voltage of the selected bit line equal to or higher than the predetermined voltage.

16. The inspection method for a non-volatile memory device according to claim 14, wherein the voltage control circuit includes a clamp circuit.

17. A computer program product, in a computer readable medium, for executing an inspection method for a non-volatile memory device, wherein the program causes a computer to execute an inspection method comprising:
selecting a selected word line from a plurality of word lines;
selecting a selected bit line from a plurality of bit lines;
writing data to a selected cell by causing a constant current on the selected cell and the selected bit line while keeping a voltage of the selected bit line equal to or higher than a predetermined voltage;
determining whether data is written to the selected cell or not; and
determining the selected cell as failure when the data is not written to the selected cell.

18. The non-volatile memory device according to claim 1, wherein the plurality of memory cells which are connected to the same bit line are connected to a same source line of the plurality of source lines.

19. The inspection method according to claim 10, wherein the plurality of memory cells which are connected to the same bit line are connected to a same source line of the plurality of source lines.

20. A computer program product, in a computer readable medium, for executing an inspection method for a non-volatile memory device, wherein the program causes a computer to execute an inspection method comprising:
selecting a selected word line from a plurality of word lines;
selecting a selected bit line from a plurality of bit lines;
writing data to a selected cell by causing a constant current on the selected cell and the selected bit line while keeping a voltage of the selected bit line equal to or higher than a predetermined voltage; and
determining whether data is written to the selected cell or not,
wherein the non-volatile memory comprises a plurality of source lines corresponding to a plurality of memory cells which are connected to a same bit line.

21. The computer program according to claim 20, wherein the plurality of memory cells which are connected to the same bit line are connected to a same source line of the plurality of source lines.

* * * * *